United States Patent [19]

Katsuyama et al.

[11] Patent Number: 5,223,789
[45] Date of Patent: Jun. 29, 1993

[54] AC/DC CURRENT DETECTING METHOD

[75] Inventors: Shoji Katsuyama; Yasutoshi Ide; Hideki Koyama, all of Kanagawa, Japan

[73] Assignee: Fuji Electric Co., Ltd., Kanagawa, Japan

[21] Appl. No.: 861,170

[22] Filed: Mar. 27, 1992

Related U.S. Application Data

[63] Continuation of Ser. No. 531,634, Jun. 1, 1990, abandoned.

[30] Foreign Application Priority Data

| Jun. 23, 1989 [JP] | Japan | 1-161334 |
| Aug. 5, 1989 [JP] | Japan | 1-203478 |
| Dec. 12, 1989 [JP] | Japan | 1-322084 |

[51] Int. Cl.$^5$ .................................................. G01R 33/00
[52] U.S. Cl. ............................... 324/127; 324/117 R; 336/174
[58] Field of Search ............... 336/174, 175; 324/253, 324/127, 117 R

[56] References Cited

U.S. PATENT DOCUMENTS

| 1,524,285 | 1/1925 | Besag | 340/870.31 |
| 2,739,285 | 3/1956 | Windsor | 324/253 |
| 2,849,662 | 8/1958 | Britten | 324/117 R |
| 2,856,584 | 10/1958 | Stratton | 324/117 R |
| 3,136,948 | 6/1964 | Windsor | 324/117 R |
| 3,233,171 | 2/1966 | Yamaguchi et al. | 324/253 |
| 3,281,670 | 10/1966 | Myers et al. | 324/253 |
| 3,454,879 | 7/1969 | Smitka | 324/117 R |
| 3,467,864 | 9/1969 | Vander | 324/117 R |
| 3,718,872 | 2/1973 | Takeuchi | 324/117 R |
| 4,021,729 | 5/1977 | Hudom, Jr. | 324/117 R |
| 4,060,761 | 11/1977 | Rhodes | 324/253 |
| 4,274,051 | 6/1981 | Condon | 324/117 R |
| 4,276,510 | 6/1981 | Tompkins et al. | 324/117 R |
| 4,615,106 | 10/1986 | Grimes et al. | 336/213 |
| 4,621,248 | 11/1986 | Shigeta et al. | 336/213 |
| 4,649,639 | 3/1987 | Mas | 336/182 |

FOREIGN PATENT DOCUMENTS

| 2602560 | 7/1976 | Fed. Rep. of Germany . |
| 3332652A1 | 4/1985 | Fed. Rep. of Germany . |
| 0026875 | 2/1977 | Japan | 324/117 R |
| 1-158365 | 6/1989 | Japan . |

Primary Examiner—Kenneth A. Wieder
Assistant Examiner—William J. Burns
Attorney, Agent, or Firm—Finnegan, Henderson, Farabow, Garrett & Dunner

[57] ABSTRACT

An AC/DC current detection method that can detect small and large changes in current, by employing a high-frequency excitation current applied to a coil wrapped around an annular iron core. The change in this value is determined for operation in the region of the coercive force of the iron core or as the change in an extreme value thereof.

6 Claims, 13 Drawing Sheets

AC/DC CURRENT DETECTING METHOD

This application is a continuation of application Ser. No. 07/531,634 filed Jun. 1, 1990, now abandoned.

BACKGROUND OF THE INVENTION

The present invention relates to a method for detecting an AC/DC current without electrical contact by using the magnetic coupling in an iron core. The present invention may be used in zero-phase current detectors, or various kinds of leakage current detectors.

A zero-phase current transformer using earth-leakage circuit breakers, and earth-leakage protective relays detects small current without electrical contact. FIG. 19 shows the basic configuration of a prior art zero-phase transformer. As shown in FIG. 19, the zero-phase transformer comprises two conductors 2 passing through the center hole of an annular iron core 1 which has a high permeability. A resistor 4 is connected between the ends of detection coil 3 which is wound on iron core 1. Each of the conductors 2 is connected between AC source 5 and load 6 of the main circuit. Under normal conditions, forward and backward currents, $I_1$ and $I_2$, respectively flow in the two conductors 2 and have the same value, but are opposite in direction, as shown by the arrows in FIG. 19. Thus, iron core 1 is not magnetized and no voltage is induced in detection coil 3. With earth leakage in the load 6 side, the values of the currents $I_1$ and $I_2$ become different, magnetizing iron core 1 and inducing a voltage. As a result, a current flows in resistor 4 and the resulting voltage across resistor 4 can be taken out as a control signal. Although FIG. 19 shows a single phase, it is understood that the same theory can be applied to three phases if three sets of conductors 2 are provided. The current which can be detected by the zero-phase transformer is, theoretically, only an AC zero-phase current. The zero phase transformer cannot be used for a DC current.

The following prior art methods have been proposed to detect a DC current without electrical contact with the main circuit. Apparatus to realize these methods is not shown.

One of the methods is a DC current transformer which uses two closed magnetic circuit iron cores. The iron cores are preliminarily excited by an AC current to have magnetic flux directions opposite to each other. Where a DC magnetic field caused by a detected current is applied, the AC current changes. As a result, the DC current can be detected based on the change in the AC current.

Another method is a Hall element detector. According to the Hall element method, a current to be detected can be measured by a Hall element inserted in a gap in an iron core.

Recently, preventive maintenance has been regarded as important, so there has been a demand for earth-leakage circuit breakers, earth-leakage protective relays, and like ground fault circuit breakers, for DC appliances. However, the aforementioned DC current detecting methods cannot respond to this demand.

The current which can be detected by the zero-phase transformer is only an AC current as described above. Further, where such an AC current is detected, the detected current is small. The detected magnetic field is then also small, as shown in the magnetization curve in FIG. 20, even though a high-premeability material such as Fe-Ni alloy, for example, Permalloy (tradename), is used as iron core 1. Accordingly, the magnetic flux obtained is low, so that the size and weight of the detector must be increased.

The method of detecting a DC current using a DC current transformer is inappropriate because two iron cores are required. This increases the size of the detector. Therefore, this method is theoretically unsuitable for a small current even though it may be suitable for a large current.

The method of detecting a DC current using a Hall element detector is inappropriate because the gap in the iron core is easily influenced by an outside magnetic field. Therefore, magnetic shielding is required. Accordingly, the size of the detector is increased. Further, when the main current is large and the current to be detected is small, as in a zero-phase transformer, the magnetic field induced by the main current cannot be balanced to zero because of the influence caused by the gap in the iron core.

As described above, no apparatus suitable for detecting a DC differential current has been provided. In addition, the DC current to be detected for controlling earth-leakage circuit breakers, earth-leakage protective relays, and the like, may not be a perfect DC current but may be a pulsating current obtained by rectifying an AC current.

SUMMARY OF THE INVENTION

It is therefore an object of the present invention to provide a method which can detect both an AC current and a DC current in a relatively compact apparatus.

To solve the aforementioned problems, the method according to the invention performs high-frequency excitation on an iron core in the positive region and in the negative region so that the magnetic field in the magnetic hysteresis curve of the iron core is more than the coercive force. The high-frequency excitation current is then changed by a magnetic field induced by a detected current.

The method of the present invention is as follows. A high-frequency coil is wound on an iron core which has an excellent property of rectangular magnetic hysteresis and a small coercive force. A detection resistor, having a relatively small resistance compared with the reactance of the iron core, and the high-frequency coil portion are connected in series, the latter being coupled with the iron core. The iron core is excited with a high-frequency electric source so that its magnetic field is greater than its coercive force. When a small magnetic field is induced by a current to be detected, flowing in a conductor passing through the center hole of the iron core in the excitation state, the range of the hysteresis curve is shifted which shifts the magnetic flux density and the range of the magnetic field. Consequently, the high-frequency excitation current changes. Therefore, the current in a main circuit is determined by taking out the change in the high-frequency excitation current as a voltage drop across the detection resistor or as a voltage change between the opposite ends of the high-frequency excitation coil, and performing signal processing by an electronic circuit. A circuit for detecting a large current flowing instantaneously can be used in combination with the aforementioned circuit so it is possible to detect a large current as well as a small current.

When the iron core is excited by a high frequency as described above, the range of excitation on the hysteresis curve of the iron core is shifted based on a small magnetic field induced by the detected current. With the shift in the range of excitation, the value of the high-frequency excitation current in the vicinity of the coercive force and the extreme value of the high frequency excitation current change. Accordingly, an AC/DC current can be detected based on the difference between the absolute values of the positive and negative current values of the high frequency excitation current. Also, a large current flowing instantaneously can be detected based on the sum of the absolute values.

BRIEF DESCRIPTION OF THE DRAWINGS

The present invention will be better understood by reference to the accompanying drawings, wherein.

Figure 1:
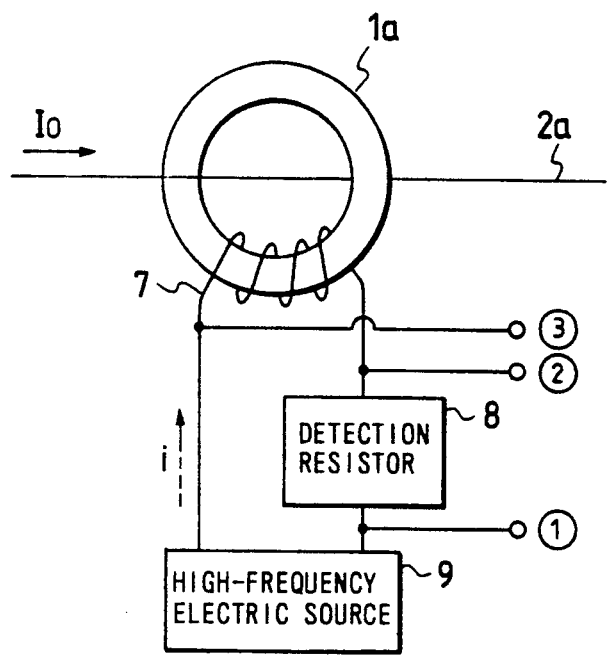
FIG. 1 is a block diagram of a small current detecting embodiment of the present invention.

DETAILED DESCRIPTION OF THE PREFERRED EMBODIMENTS:

FIG. 1 is a view of an embodiment of the present invention, used for detecting a small AC/DC current. Iron core 1a, of FIG. 1, has a rectangular hysteresis curve as its magnetic characteristic and is made of a material with a small coercive force value. The iron core 1a has an annular shape. A conductor 2a is passed through the center hole of annular iron core 1a and is connected to an electric source and a load which are not shown. In practice, two or three conductors 2a are provided to detect a zero-phase current using the difference between the currents in the several conductors. The theory when using such a plurality of conductors is the same as when current in a single conductor is detected. Accordingly, only one conductor 2a is shown in FIG. 1.

The detected current has a direction shown by the arrow in FIG. 1 and has a value $I_0$. Further, a high-frequency excitation coil 7 is wound on a thick portion of iron core 1a and is connected to a high-frequency electric source 9 through a detection resistor 8 which has a smaller resistance value than the reactive impedance value of the iron core. A high-frequency excitation current i flows in the direction of the broken-line arrow. A signal from detection resistor 8 is taken out through terminals ① and ② and a signal from high-frequency excitation coil 7 is taken out through terminals ② and ③. Terminal ② is a common terminal for both signals.

Figure 2:
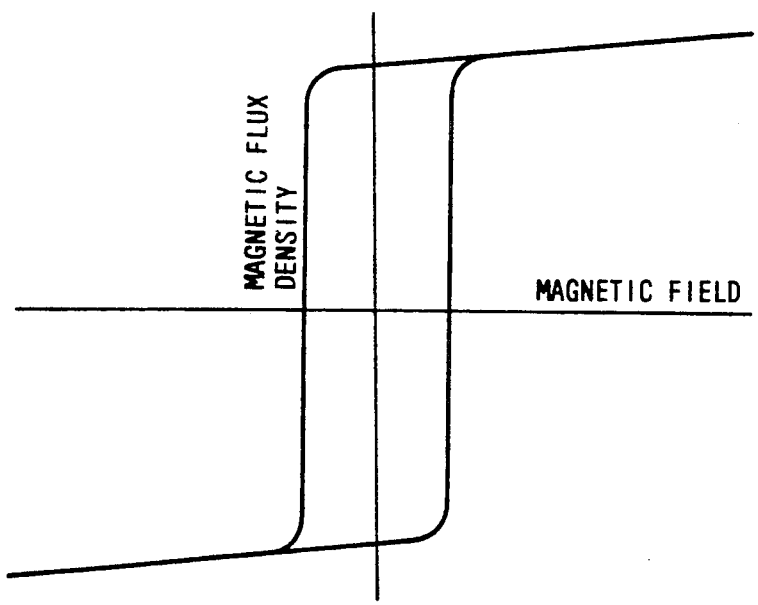
FIG. 2 is a magnetic hysteresis curve of an iron core material.
Figure 3:
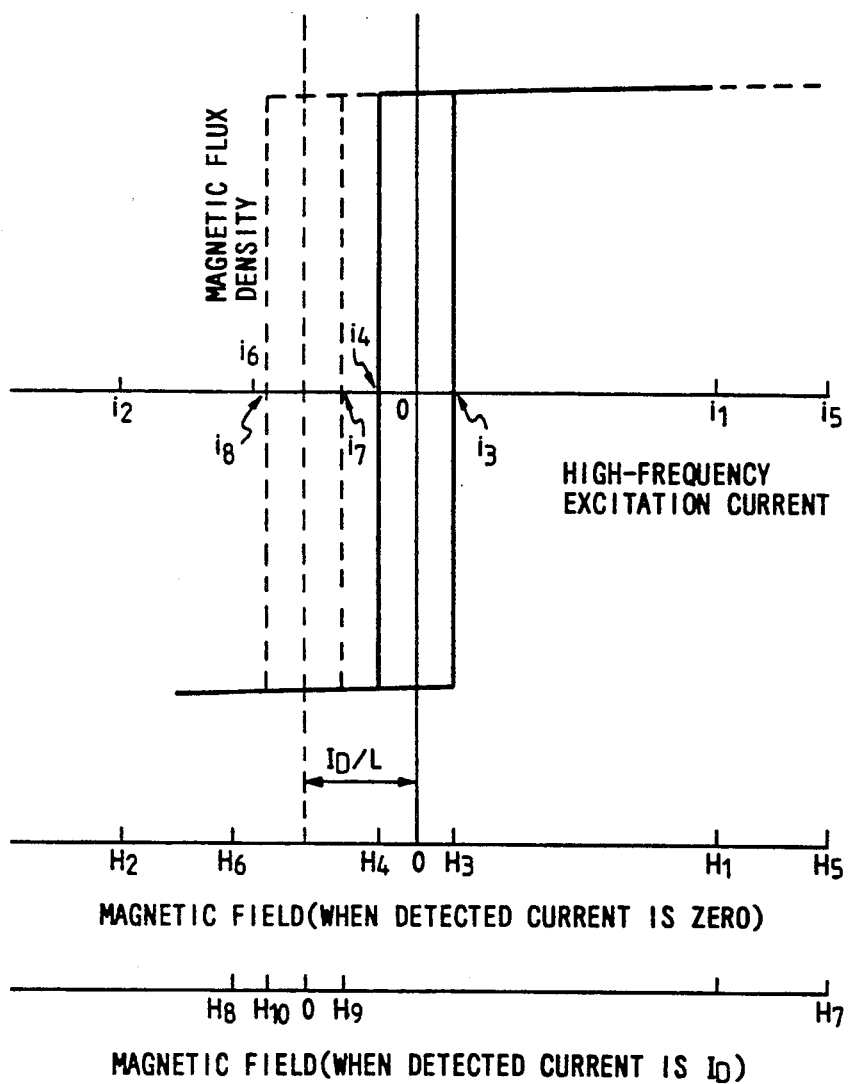
FIG. 3 is a magnetic characteristic graph showing an idealized form of the magnetic hysteresis curve.
Figure 4:
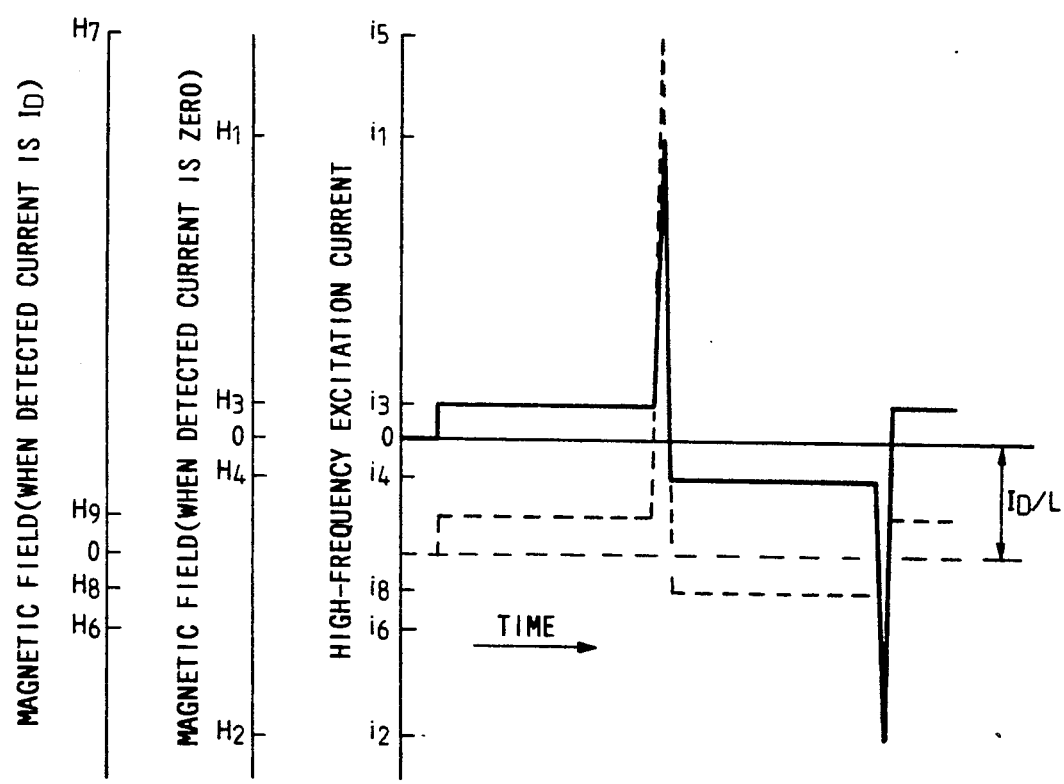
FIG. 4 is a graph showing the relationship between the magnetic field produced in the iron core and the high-frequency excitation current waveform.
Figure 5A:
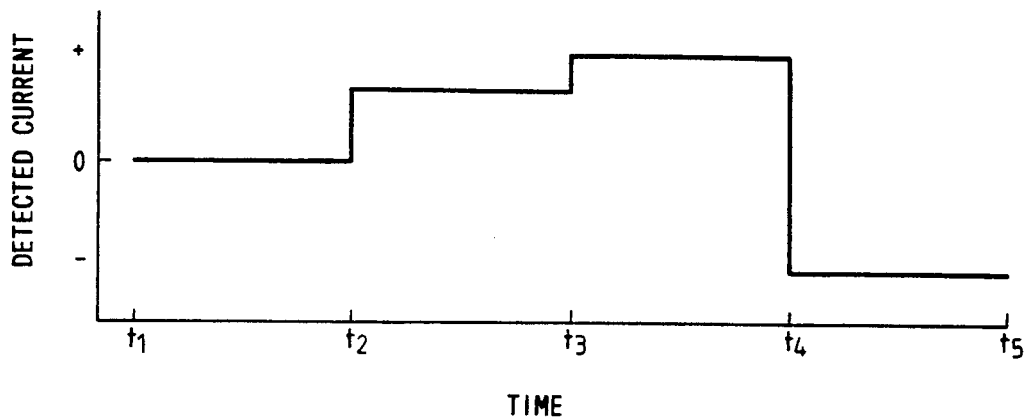
FIG. 5(a) is a graph of detected current versus time in the embodiment shown in FIG. 1.
Figure 5B:
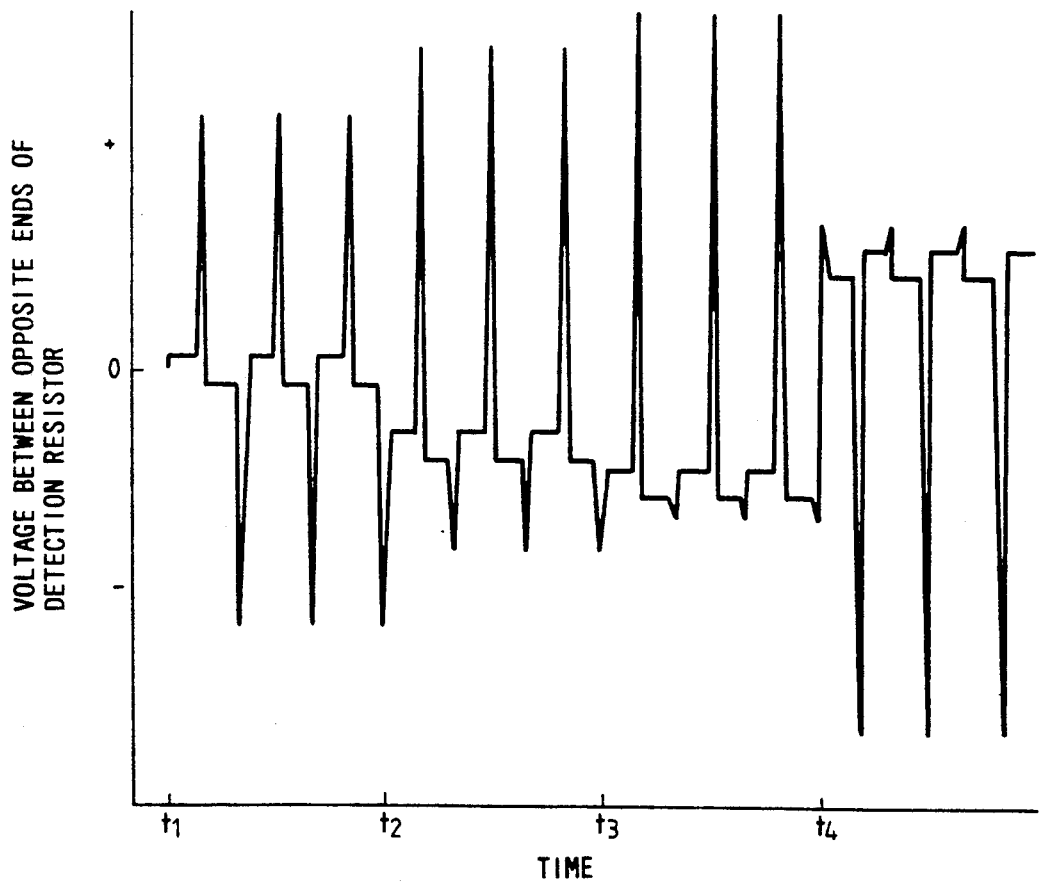
FIG. 5(b) is a graph of the voltage between the opposite ends of a detection resistor versus time in the embodiment shown in FIG. 1.

FIG. 2 shows the magnetic hysteresis curve of iron core 1a. FIG. 3 is a magnetic characteristic graph for expressing linearly, approximately, the curve shown in FIG. 2. FIG. 4 is a waveform diagram showing the magnetic field and the high-frequency excitation current. FIGS. 5(a) and 5(b) are waveform diagrams showing the detected current and the voltage between the opposite ends of the detection resistor 8, respectively.

The operation of the method of the invention is described with reference to the embodiment shown in FIG. 1, the magnetic characteristic graph of FIG. 3, and the waveform diagrams of FIGS. 4, 5(a), and 5(b). The iron core 1a is excited by high-frequency electric source 9, resistor 8 and high-frequency excitation coil 7 shown in FIG. 1. The relationships between the high-frequency impressed voltage $E_H$, magnetic flux density B, and excitation current i, in the iron core 1a are expressed by equation (1).

$$E_H = iR + N_H A_c \frac{dB}{dt} \quad (1)$$

where
$E_H$:high-frequency impressed voltage
i:high-frequency excitation current
R:detection resistance $N_H$:number of windings in the high-frequency excitation coil
$A_c$:magnetic circuit cross area
B:magnetic flux density
t:time If the following relationship (2) is established, B does not change even though a magnetic field may be induced by the current of another coil, so long as $E_H$ is constant.

$$iR < N_H A_c \frac{dB}{dt} \qquad (2)$$

The relationship between the magnetic field and the electric current is expressed by equation (3)

$$H_i = N_H(i/L) \qquad (3)$$

where
$H_i$:magnetic field caused by high-frequency excitation current
L:magnetic circuit length For ease of description, the magnetic circuit condition is assumed to be established based on equation (4).

$$N_H = L \qquad (4)$$

Accordingly, under the condition of equation (4), equation (3) can be rewritten as equation (5).

$$H_i = i \qquad (5)$$

where the number of windings is one because conductor 2a is passed through the center hole of iron core 1a.

The magnetic field $H_1$ induced by the detected current $I_0$ is represented by equation (6).

$$H_1 = I_0/L \qquad (6)$$

Following, a method of the invention is described, with reference to magnetic characteristic graph of FIG. 3, waveform diagram of FIG. 4 and on the basis of the relationship between the two graphs. For ease of description, detected current $I_0$ is replaced with $I_D$ when the detected current is a DC current.

When the detected current, $I_D$, flowing in conductor 2a, is zero, the zero point of the magnetic field coincides with the zero point of the high-frequency excitation current shown as i, in FIGS. 3 and 4. Accordingly, iron core 1a is excited within the range of the high-frequency excitation current between $i_1$ and $i_2$ as shown by the solid line in FIGS. 3 and 4. The waveform of the high-frequency excitation current i changes as shown by the solid line in FIG. 4, so that high-frequency excitation current i takes on the almost constant values of $i_3$ and $i_4$. in the vicinity of the coercive force of iron core 1a. When the magnetic flux enters the saturation region, the high-frequency excitation current increases rapidly to the values of $i_1$ and $i_2$.

When a positive DC current $I_D$ flows in conductor 2a and a magnetic field $I_D/L$, is impressed, the hysteresis curve of FIG. 3, where the high-frequency excitation current i is the abscissa is shifted to the negative side, as shown by the broken lines in FIG. 3. As a result, the high-frequency excitation current i takes the extreme values of $i_5$ and $i_5$ and $i_6$, and i in the vicinity of the coercive force takes $i_7$, $i_8$, so the wave form of the current i is shown by the broken line in FIG. 4. So, the magnetic field where the detected current $I_D$ is positive, has a waveform with the zero point shifted to the negative side by an amount equal to $I_D/L$ as shown in FIG. 4. Thus, the positive-side extreme value of the high-frequency excitation current i increases ($i_1 \rightarrow i_5$) and the negative-side extreme value decreases ($i_2 \rightarrow i_6$). Further, currents $i_3$ and $i_4$ corresponding to the current in the vicinity of the coercive force, decrease to be $i_7$ and $i_8$, respectively. When the current in conductor 2a is negative, the same phenomenon occurs except that the changes in the magnetic field and the current are in the opposite directions.

FIGS. 5(a) and 5(b) show the change in the detected current and the waveform representing the voltage between the opposite ends of the detection resistor 8, respectively. When DC current $I_D$ flows in conductor 2a as shown in FIG. 5(a), a voltage drop having the same waveform as high-frequency excitation current i, shown in FIG. 4, is produced between opposite ends of detection resistor 8. When detected current $I_D$ is zero, the high-frequency excitation current i is symmetrical with respect to the positive and negative side as shown between $t_1$ and $t_2$ of FIGS. 5(a) and 5(b). When a positive detected current $I_D$ flows, the positive extreme value of the high-frequency excitation current increases and the negative extreme value (absolute value) decreases as shown between $t_2$ and $t_4$ in FIGS. 5(a) and 5(b). When the detected current $I_D$ is negative, the changes in the extreme values are reversed as shown between $t_4$ and $t_5$ in FIGS. 5(a) and 5(b). Conversely, the value of the high-frequency excitation current i in the vicinity of the coercive force is shifted to the negative side when $I_D$ is positive, as shown in FIG. 4, and to the positive when $I_D$ is negative. Accordingly, detected current $I_D$ can be calculated from the values of the high-frequency excitation current i in the vicinity of the coercive force or from the changes in the extreme values of the high-frequency excitation current. When the detected current is an AC current, the detected current $I_D$ can be calculated substantially in the same manner as described above except that the phenomenon is faster.

Although this embodiment of the present invention has been described based on the change in the high-frequency excitation current i and, the resulting change in the voltage between opposite ends of detection resistor 8, the detected current $I_D$ can be calculated from the second term, in the right side of equation (1). This term represents the voltage between terminals ② and ③ of high-frequency excitation coil 7 because $E_H$ is constant.

Following, a method for determining detected current $I_D$ from the values of the high-frequency excitation current i in the vicinity of the coercive force is described. A method for calculating the detected current $I_D$ from the voltage across opposite ends ① and e,crc/2/ of the detection resistor 8 is described.

Figure 6:
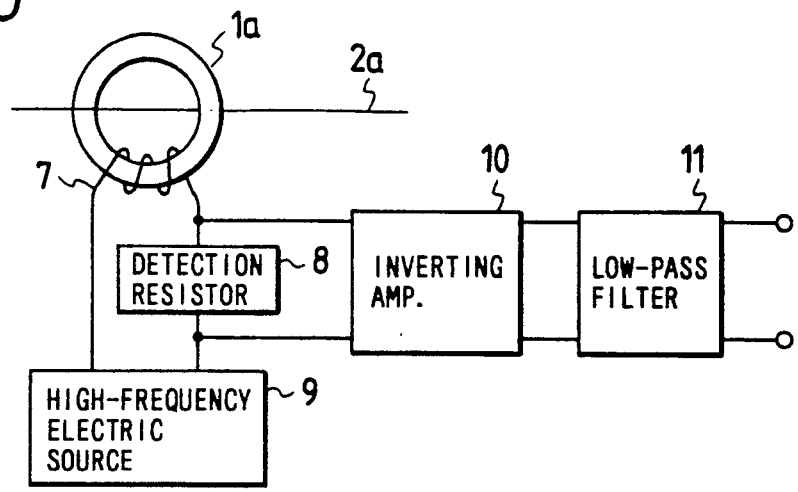
FIG. 6 is a block diagram of an embodiment of the present invention where the detected current is calculated from the voltage between, the opposite ends of the detection resistor.
Figure 7A:
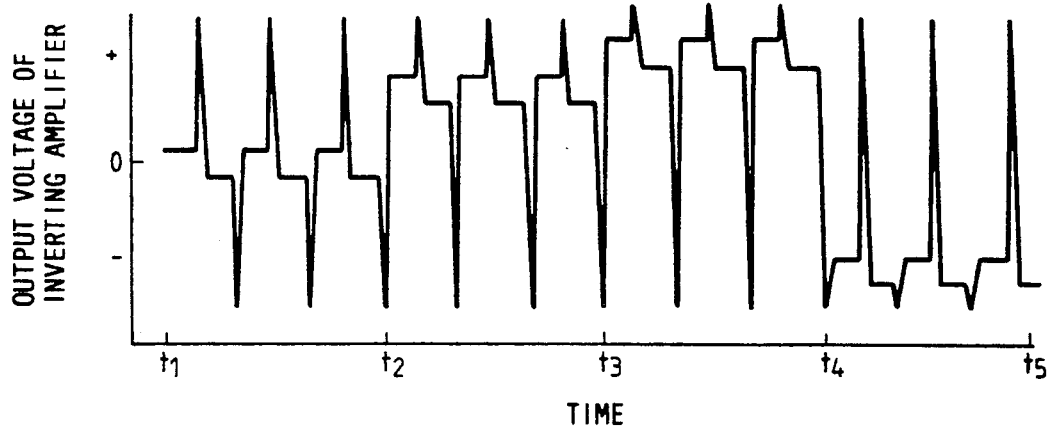
FIG. 7(a) is a waveform diagram of the output voltage of the inverting amplifier of FIG. 6.
Figure 7B:
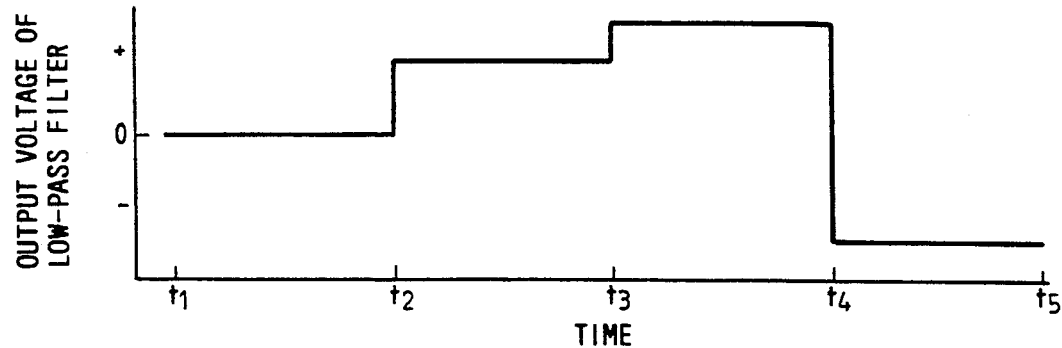
FIG. 7(b) is a waveform diagram of the output voltage of the low-pass filter of FIG. 6.

FIG. 6 is a block diagram for describing this method. Like numerals in FIGS. 1 and 6 represent like parts. In FIG. 6, an inverting amplifier 10 and a low-pass filter 11 are connected to the ends of the detection resistor 8 and perform signal processing. When the detected current waveform of FIG. 5(a) is measured by the current detector of FIG. 6, the inverting amplifier output waveform of FIG. 7(a) is obtained. The waveform is shaped so that the extreme values of the voltage across the detection resistor 8, as shown in FIG. 5(b), are saturated as constant values by inverting amplifier 10. When the voltage shown in FIG. 7(a) is passed through the low-pass filter 11, the output takes values proportional to FIG. 5(a), as shown in FIG. 7(b). Thus, the output voltage from low-pass filter 11 is proportional to detected current $I_D$.

In more detail, the positive and negative values of the output of inverting amplifier 10 are shown in FIG. 7(a). When the DC detected current $I_D$ is zero, the output of the low-pass filter 11 equals zero as shown in FIG. 7(b). When detected DC current $I_D$ is positive, the output of the inverting amplifier 10 is shifted to the positive side, as shown in FIG. 7(a). This region, from $t_2$ to $t_4$, corresponds to the coercive force. Then, the output of low-pass filter 11 becomes a positive voltage as shown between $t_2$ and $t_4$ in FIG. 7(b) because the output of low-pass filter 11 is expressed by the difference between the absolute values of the positive and negative voltages. When $I_D$ is negative, the positive and negative voltages are reversed. Therefore, an output voltage proportional to detected current $I_D$ can be obtained from low-pass filter 11.

When the detected current is an AC current, the current can be detected substantially in the same manner as described above, except that the changes in the respective values occur faster. According to the method of the invention, a small current having any suitable form, such as a distorted wave, a square wave and the like, can be detected as described above.

From FIGS. 3 and 4 the range of current detection according to the present invention is between $i_4$ and $i_2$ when detected current $I_D$ is positive, and between $i_3$ and $i_1$ when detected current $I_D$ is negative. However, the range may be suitably determined by changing the winding number in high-frequency excitation coil 7, detection resistor 8 or high-frequency impressed voltage $E_H$.

It is necessary that the material of iron core 1a have a good high-frequency characteristic because the iron core 1a must be excited by a high frequency. It is theoretically preferable that the frequency of high-frequency excitation electric source 9 be high. In practice, the frequency must be determined by considering various factors. These include frequency components of the detected current $I_D$, detection accuracy required, frequency characteristics of the iron core material and the like.

The method for calculating detected current $I_D$ can be determined from the change in voltage across terminals ② and ③ of high-frequency excitation coil 7. The detected current can be calculated in the same manner as in the case where it is calculated from the terminals ① and ② of the detection resistor 8. Accordingly, description of this method is not necessary.

Figure 8:
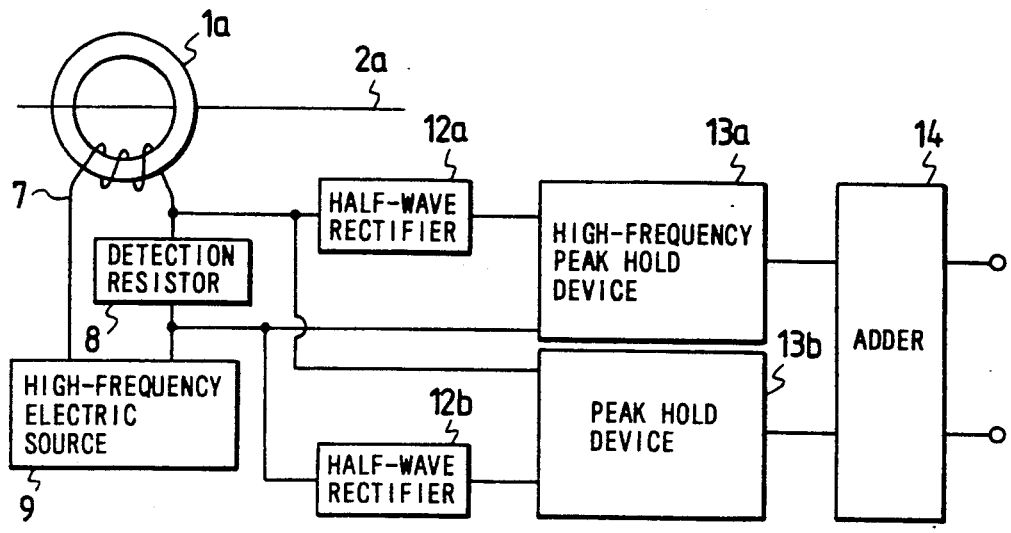
FIG. 8 is a block diagram of an embodiment of the present invention where the detected current is calculated from the voltage between opposite ends of the high-frequency excitation coil.
Figure 9A:
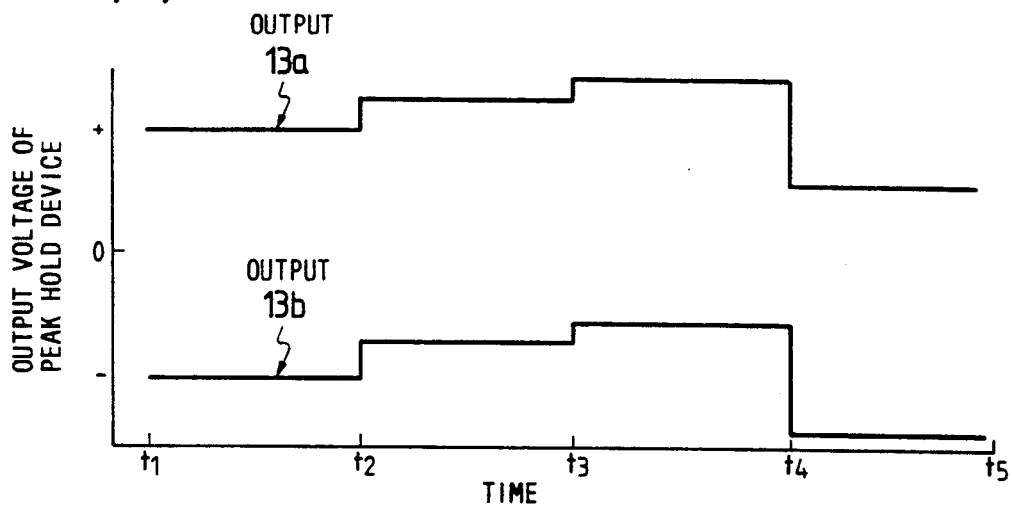
FIG. 9(a) is a waveform diagram of the output voltage of the peak hold device of FIG. 8.
Figure 9B:
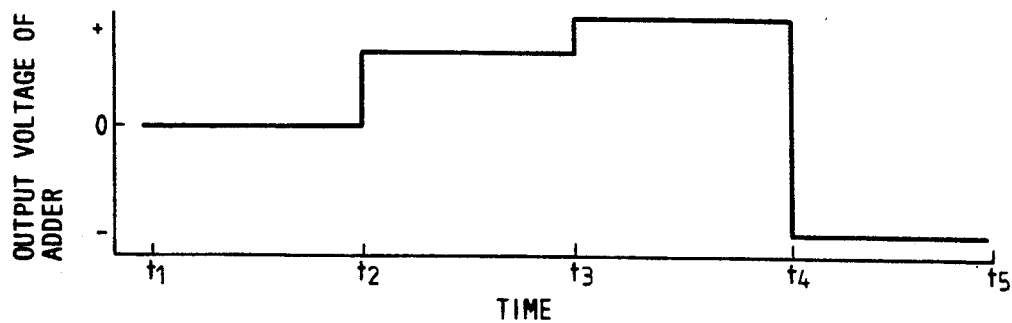
FIG. 9 (b) is a waveform diagram of the output voltage of the adder of FIG. 8.

Following, a second current detecting method is described. This method calculates detected current $I_D$ from the change in the extreme values of high-frequency excitation current i. FIG. 8 is a block diagram for describing this method. Like numerals in FIGS. 1 and 8 represent like parts. FIG. 8 shows a half-wave rectifier circuit 12a for rectifying low voltage and high voltage through an operational amplifier and a rectifier. Half-wave rectifier 12a is connected to a high-frequency peak hold device 13a. Another combination of a half-wave rectifier circuit 12b and a peak hold device 13b is connected in series to the former combination of half-wave rectifier 12a and peak hold device 13a. Both are connected between the opposite ends of detection resistor 8. The output of 13a and 13b are connected to an adder 14 and perform the following signal processing. When current having the waveform shown in FIG. 5(a) is detected by the apparatus of FIG. 8, the voltage across the ends of detection resistor 8 changes as shown in FIG. 5(b). The form of the positive and negative extreme values of output voltage are plotted in FIG. 9(a). When detected current $I_D$ is zero, from $t_1$ to $t_2$, the positive and negative values of output of the high-frequency peak-hold devices 13a and 13b have the same absolute value as shown in FIG. 9(a). The output of adder 14 is then zero, as shown in FIG. 9(b). When DC detected current $I_D$ is positive, from $t_2$ to $t_4$, both the positive value of peak-hold device 13a and the negative value of peak-hold device 13b increase, so that the output of adder 14 takes a positive value, as shown in FIG. 9(b). When $I_D$ is negative, from $t_4$ to $t_5$, the outputs of the peak hold devices 13a and 13b decrease, so that the output of adder takes a negative value. Thus, the output of adder 14 is a voltage proportional to detected current $I_D$, as shown in FIG. 9(b).

When the detected current is an AC current, the current can be detected substantially in the same manner as using the vicinity of the coercive force, except that changes in the respective values of FIGS. 5(a) and 5(b) occur faster. Also, detected current $I_D$ can be calculated by the change in the voltage across the opposite ends of high-frequency excitation coil 7 using this method.

The current detecting method previously described is particularly effective for zero-phase current detection. However, when the aforementioned method is used in an earth-leakage circuit breaker, there is a problem when the load forms a ground short circuit. The current detectors to FIGS. 1, 6 and 8 are suitable for current detection of a relatively small current but are unsuitable for detection of a relatively large current. When the current flowing in the detector is so large that the detector cannot follow it, the magnetic flux of the iron core enters into the saturation region to make detection impossible because the positive and negative values of the high-frequency excitation current become excessive. Accordingly, there is no problem when the aforementioned detectors are used in an earth leakage breaker within its ordinary leakage range. However, current detection is impossible if a large current is produced by a ground short circuit or the like.

Figure 10:
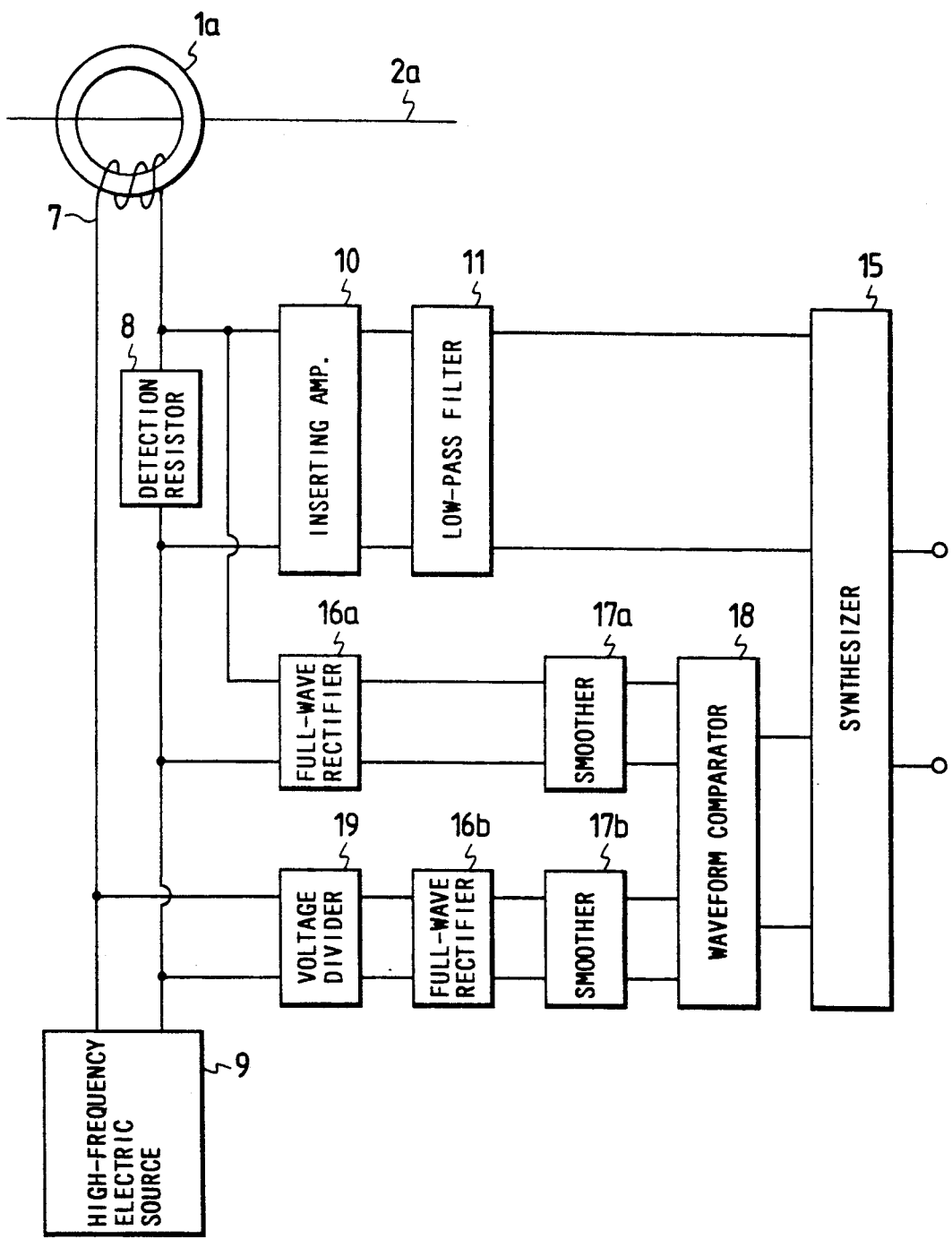
FIG. 10 is a block diagram of a large-current detecting embodiment of the present invention.

Following, a current detection method is described where a large current is produced by a ground fault or the like. FIG. 10 is a block diagram of an embodiment of the present invention which operates suitably when there is an instantaneous large current such as ground fault current. Like numerals in FIGS. 1, 6, 8, and 10 represent like parts. In FIG. 10, a small current ordinary earth leakage, can be detected by the detection method described with reference to FIG. 6, and also shown here. The output of the small-current detection is connected to output synthesizer 15. A large current caused by a ground short circuit or the like, can be detected by the additional circuitry shown in FIG. 10. FIG. 10 shows a full-wave rectifier 16a and a smoother 17a connected between detection resistor 8 and waveform comparator 18. A voltage divider 19, for taking out the voltage of high-frequency excitation electric source 9, a full-wave rectifier 16b, and a smoother 17b are connected to waveform comparator 18. The waveform comparator 18 is connected to output synthesizer 15.

Figure 11A:
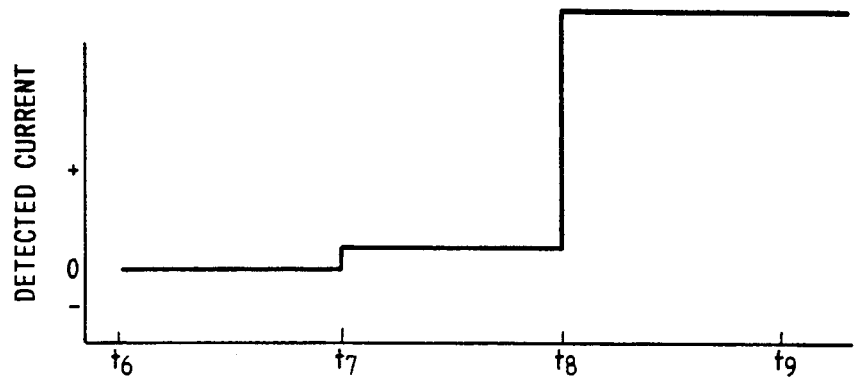
FIG. 11(a) is a graph of detected current versus time in the embodiment of FIG. 10.
Figure 11B:
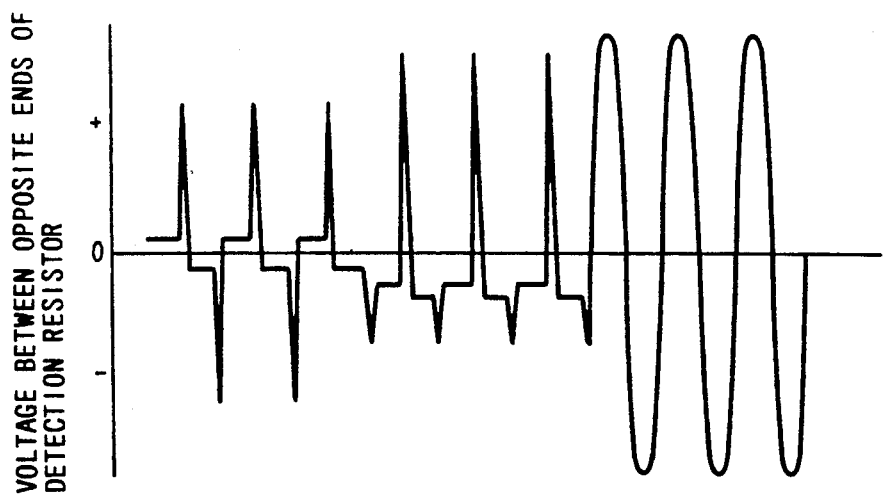
FIG. 11(b) is a waveform diagram of the output voltage between the opposite ends of the detection resistor of FIG. 10.

FIG. 11(a) shows the change in the detected current $I_D$ with time. FIG. 11(b) shows the change in the voltage between the opposite ends of detection resistor 8 with time. This is analogous to the change in the high-frequency excitation current i with time. In FIGS. 11(a) and 11(b), a small change in the detected current is shown between $t_6$ and $t_8$. This is the same as in FIGS. 5(a) and 5(b). When the detected current becomes very large, at $t_8$ in FIGS. 11(a) and 11(b), the flux density of iron core 1a approaches the saturation region. The range of the change in the flux density then decreases. As a result, the value of the second term in the right side of equation (1) is reduced, so that the high-frequency excitation current i is approximately expressed by equation (7). The high-frequency excitation current thus is expressed as a sine wave having large positive and negative values which are symmetrical with the zero line when the excitation current is a high-frequency electric source wave.

$$i = E_H/R \quad (7)$$

Because the output of low-pass filter 11 is expressed as the sum of the positive and negative values of the high-frequency excitation current i, the difference between the absolute values of the positive and negative values, the output becomes approximately zero after $t_8$ in FIGS. 11(a) and 11(b). The detected current cannot then be measured. The circuits which detect an increase in the positive and negative values of the high-frequency excitation current i in the large-current side are the middle circuit, 16a→17a→18→15, and the lower circuit, 19→16b→17b→18→15 in FIG. 10. When a large current occurs, no output should be generated in the small-current side. Therefore, full-wave rectifier 16a is provided in the middle circuit to prevent the output of the voltage drop caused by high-frequency excitation current i. Further, the influence of the pulse portion of the high-frequency excitation current i which occurs in the small-current side is reduced by smoother 17a.

The lower circuit is provided to produce a reference voltage. It is necessary in the large-current side, that the reference voltage have a value less than $E_H$. A slight change in the flux density of the iron core 1a, and the resulting voltage drop produced in detection resistor 8 must be considered. The reference voltage is generated through frequency divider 19, full-wave rectifier 16b, and the smoother 17b.

When detected current $I_D$ is small, the output of the smoother 17a is small. When the detected current $I_D$ is large, the range of the change in the flux density in iron core 1a is reduced so that the output of the smoother 17a increases to produce the output of waveform comparator 18. It is, therefore, necessary that the reference voltage of smoother 17b be established to produce the output of the waveform comparator 18. The output synthesizer 15 sends out the larger one of the two input signals from the small-current detection side from low-pass filter 11, and the large-current detection side, from waveform comparator 18.

Figure 12:
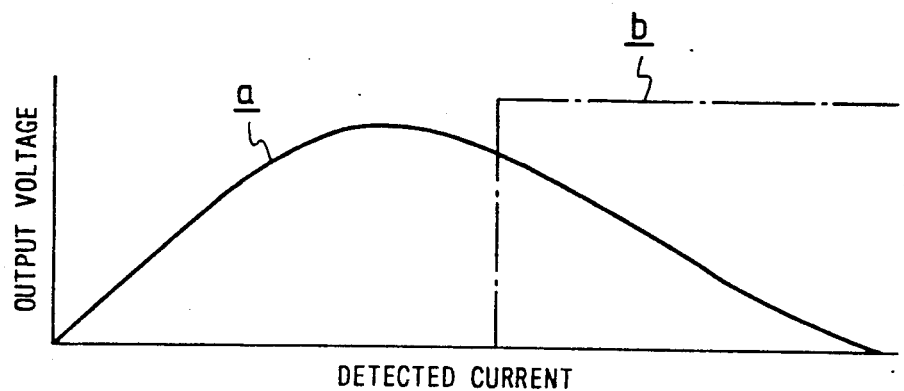
FIG. 12 is a graph of detected current versus output voltage, in the small current side, and in the large current side of FIG. 10.

FIG. 12 shows the relationship between the detected current and the output voltage. The solid-line curve a represents the output of the small-current side detecting circuit (low-pass filter 11), and broken line b represents the output of the large-current side detecting circuit (waveform comparator 18). Because output synthesizer 15 sends out the larger one of the two output values of comparator 18, the output can be produced without a problem even though a large current caused by a ground short circuit, or the like, flows instantaneously. With a leakage detector, current detection may be attained by simply detecting the fact that a current flows.

It is not necessary that the value of the current be detected in the large-current side. The object of the leakage detector can be attained sufficiently if the characteristic as shown in FIG. 12 can be obtained.

Figure 13:
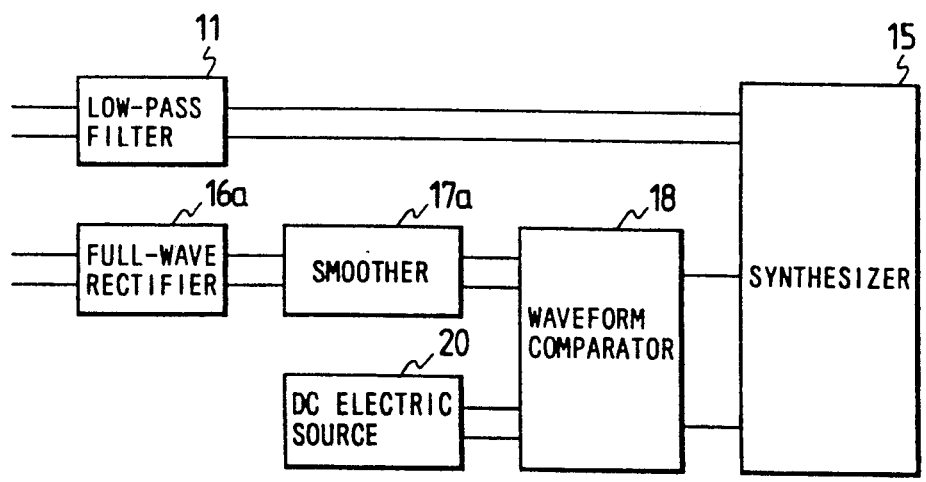
FIG. 13 is a block diagram of an embodiment of the present invention with a DC electric source as a modification of the embodiment shown in FIG. 10.

The reference voltage may be produced using a DC electric source provided separately, as shown in FIG. 13. FIG. 13 is a block diagram of such an embodiment of the present invention. The circuitry, comprising voltage divider 19, full-wave rectifier 16b, and smoother 17b as shown in FIG. 10, is replaced by DC electric source 20. The large-current side detection described in FIG. 10 can be made in substantially the same manner for this embodiment of the present invention. Accordingly, description of these elements is not necessary.

The configuration and operation of several embodiments of an AC/DC current detector according to the present invention have been described. Following, a practical example of an embodiment of the present invention is described with reference to FIG. 6. The iron core 1a was prepared by winding an amorphous alloy thin belt of the composition 82Co-2Ni-4.5Fe-8.5Si-3B to form a cylindrical winding-type iron core. The winding-type core was subjected to a heat treatment and mounted on a plastic case. The amorphous alloy had an excellent magnetic characteristic for DC current and high frequency. Further, magnetic distortion of the amorphous alloy was small, so that the influence of stress on the magnetic characteristic was small. Accordingly, the amorphous alloy was easy to handle and was suitable for use as iron core 1a. The dimensions of iron core 1a were selected to be 13 mm at the external diameter, 10 mm at the internal diameter and 2 mm in height. A copper wire 1 mm in diameter was used as conductor 2a. High-frequency excitation coil 7 was prepared by winding 90 turns of copper wire 0.1 mm in diameter on a thick portion of iron core 1a by 90 turns. Because current flowing in high-frequency excitation coil 7 was small, it was sufficient to use a thin copper wire. Inverting amplifier 10 had an the amplification factor of 10 and a saturation point of $\pm 12$ V. Low-pass filter 11 comprised two filters having a cutoff frequency of 1 KHz. High-frequency excitation electric source 9 comprised a square wave generating circuit (IC) which generated a frequency of 10 KHz and a voltage of about 6 V.

Figure 14:
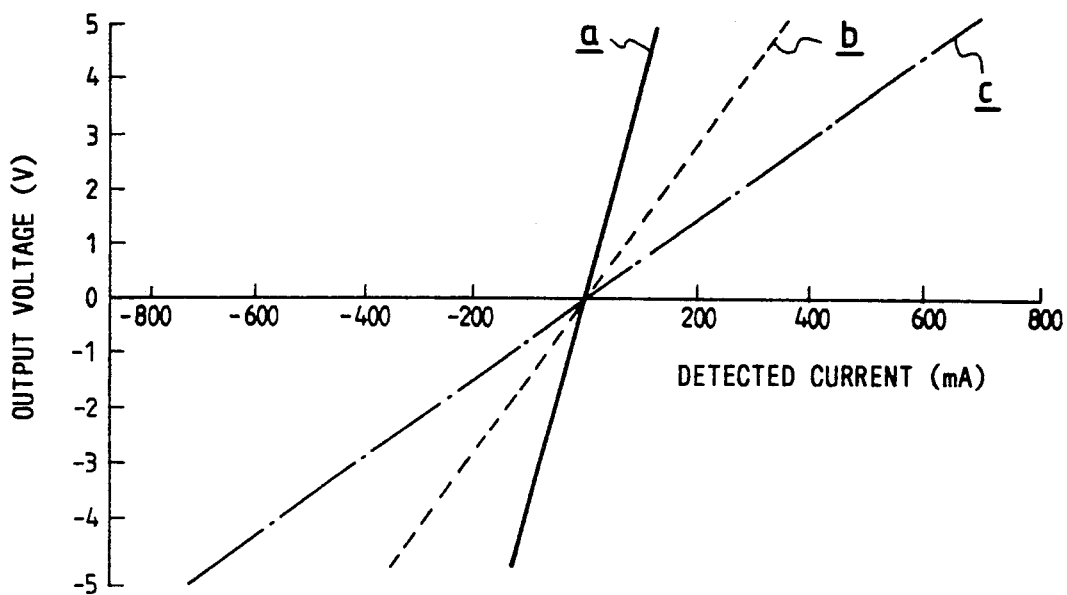
FIG. 14 is a graph of detected current versus output voltage when a DC current is detected by the embodiment of FIG. 6.

The relationship between the detected current and the output voltage obtained by DC detection in this example is shown in FIG. 14. In FIG. 14, output characteristic lines a, b and c are obtained when the values of the detection resistor 8 are 500, 200 and 100 $\Omega$, respectively. The minimum values of the current which can be detected are about 1 mA, 2 mA and 5 mA in the conditions of a, b and c, respectively. It is apparent from FIG. 14 that the characteristic lines have excellent linearity. Also, the positive and negative values of the current can be detected, and a large output voltage can be obtained.

Figure 15:
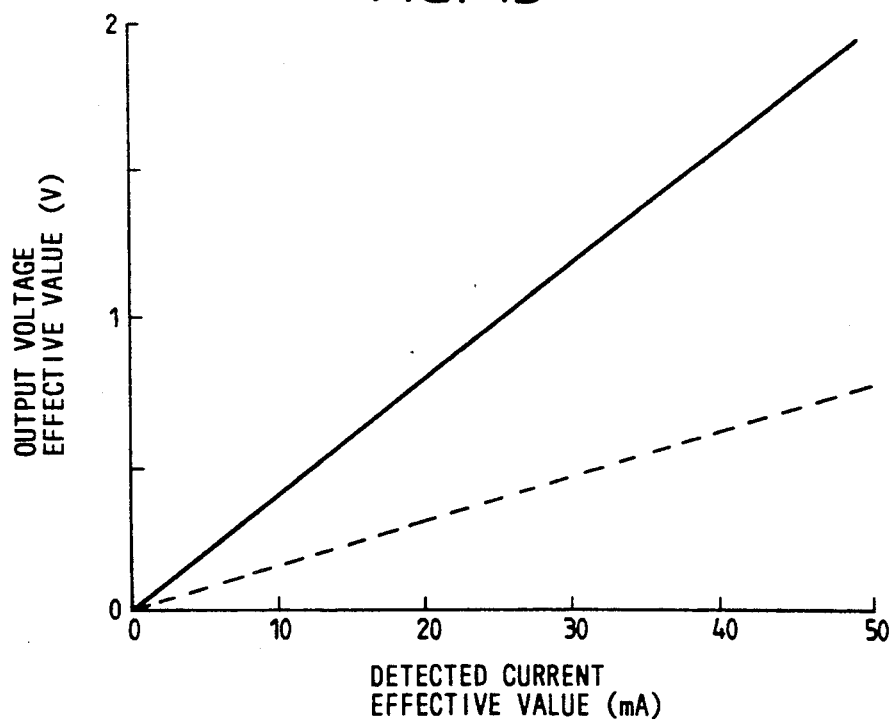
FIG. 15 is a graph of detected current effective value versus output voltage effective value when a sine-wave AC current is detected by the embodiment of FIG. 6.
Figure 19:
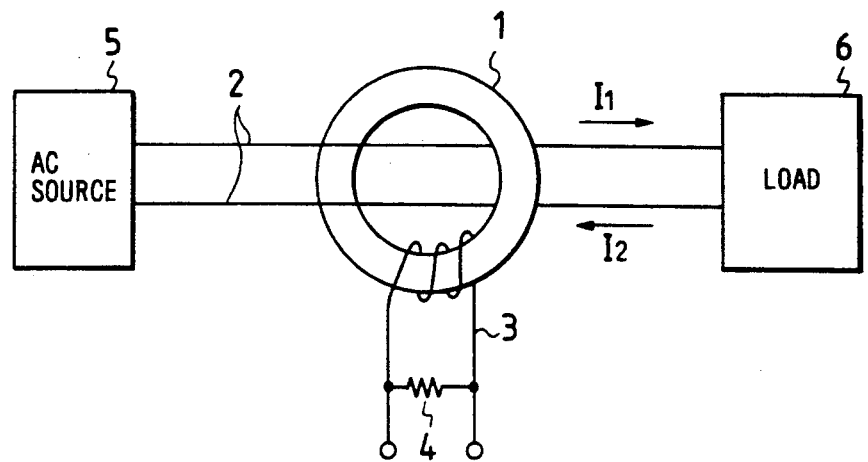
FIG. 19 is a block diagram of a prior art zero-phase transformer.
Figure 20:
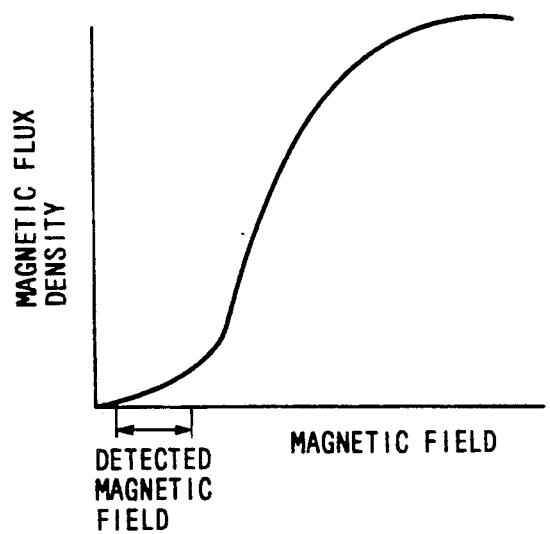
FIG. 20 is a graph shown of the magnetization curve of the iron core material shown in FIG. 19.

FIG. 15 is a characteristic graph showing the relationship between the detected current effective value and the output voltage effective value where an AC sine wave with a current of 50 Hz is detected when the detection resistor is 500 $\Omega$. For comparison, an output characteristic line obtained by the conventional apparatus shown in FIG. 19, is plotted in FIG. 15. In FIG. 15, the solid line shows the characteristic line according to the present invention and the broken line shows the prior art characteristic line. In the prior art, iron core 1 comprised Permalloy (tradename). It was equal in size to the iron core of the present invention. The winding number in detection coil 3 was set to be 500 to obtain an amplification factor of 10. It is apparent from FIG. 15 that the output voltage obtained by the method according to the present invention is about twice that of the conventional method. It is also apparent that a current comprising a superposition of a DC current and an AC current can be detected by a method according to the present invention.

Although in this embodiment the high-frequency electric source 9 generated a square wave, any suitable wave such as a sine wave, a triangular wave or the like may be used in the present invention. Further, the embodiment has shown the influence of high-frequency excitation current i reduced by saturating its extreme value with inverting amplifier 10. However, inverting amplifier 10 may be removed as long as the excitation condition can be suitably established. This is because the current mean value in this pulsating portion is sufficiently small to be neglected as compared with the current mean value in the vicinity of the coercive force. Where the inverting amplifier 10 is removed, the relationship between the direction of detected current $I_D$ and the direction of the output voltage is reversed. This is no problem in practical use because the direction of the detected current and the direction of the output voltage can be readjusted by reversing both the direction of conductor 2a, and the winding direction of high-frequency excitation coil 7.

Following, a practical example using the second method of the present invention is described with reference to FIG. 8. The iron core 1a used was the same as in the first method. The high-frequency excitation electric source 9 generated a frequency of 10 KHz (rectangle wave) and a voltage of about 6V. Half-wave rectifiers 12a and 12b were combined with operational amplifiers to avoid any influence by intrinsic electric resistance of the rectifiers, in order to obtain an ideal rectifier circuit. The adder 14 comprised circuitry which fed negative and positive components into a differential amplifier after inverting only the negative component by an integrated circuit.

Figure 16:
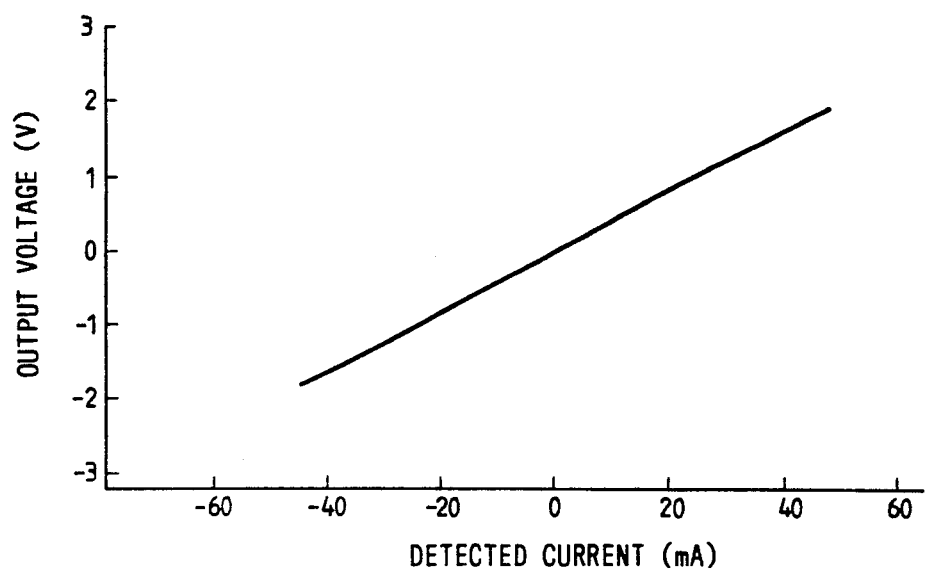
FIG. 16 is a graph of detected current versus output voltage when a DC current is detected by using the embodiment of FIG. 8.

The relationship between the detected current and the output voltage obtained by DC detection in the second example is shown in FIG. 16. It is apparent from FIG. 16 that the characteristic line has excellent linearity. Also, the positive and negative values of current can be detected, and a large output voltage can be obtained.

Figure 17:
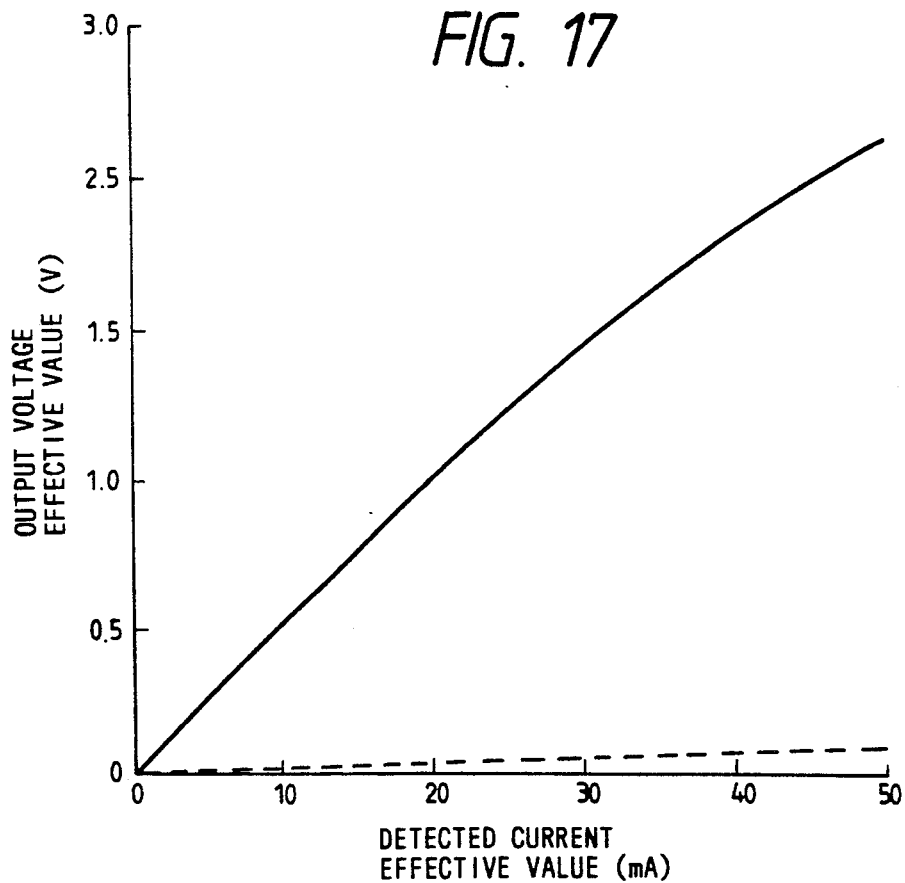
FIG. 17 is a graph of detected current effective value versus output voltage effective value when a sine-wave AC current is detected by the embodiment of FIG. 8.

FIG. 17 is a characteristic graph showing the relationship between the detected current effective value and the output voltage effective value where an AC sine wave with a current of 50 Hz is detected by the method according to the second embodiment of the present invention. For comparison, an output characteristic line obtained by the conventional apparatus shown in prior art FIG. 19 is shown in FIG. 17. In FIG. 17, the solid line shows the characteristic according to the present invention and the broken line shows the characteristic line according to the prior art. It is apparent from FIG. 17 that the output voltage obtained by this method according to the present invention is increased by about 50 times compared with the output voltage obtained by the prior art method. It is also apparent that a current comprising a superposition of a DC current and an AC current can be detected by this method.

Although the small-current detecting method according to the invention has been described where one conductor is used, it is to be understood that the method can be applied to zero-phase detectors for detecting a differential current between two or three conductors and that the size of detecting apparatus can be desirably reduced by using the method of the present invention as compared with the prior art.

Figure 18:
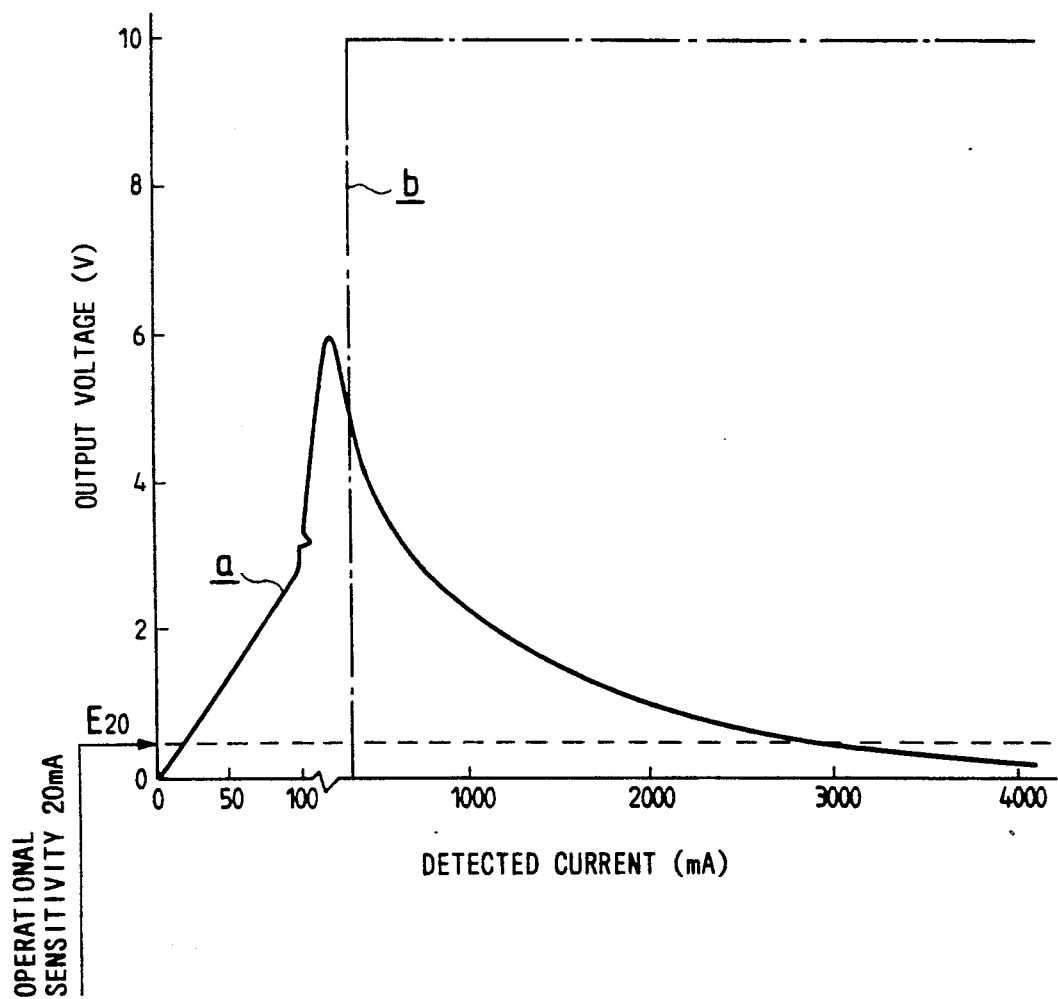
FIG. 18 is a graph of detected current versus output voltage obtained when the small-current side output voltage and the large-current side output voltage are measured by the embodiment of FIG. 10.

FIG. 18 is a characteristic graph showing the small-current side output voltage and the large-current side output voltage measured by the apparatus in FIG. 10 used in an earth-leakage circuit breaker. The characteristics of the iron core and circuitry are the same as described above (FIG. 14).

In FIG. 18, characteristic curve a represents the output of the small-current side detecting circuit and characteristic line b represents the output of the large-current side detecting circuit. The output of output synthesizer 15 is the larger one of the two output values of comparator 18. Where the invention is applied to an earth-leakage circuit breaker having an operational sensitivity of 20 mA the output voltage in the current range of 20 mA or more must always be larger than the reference output voltage $E_{20}$ at 20 mA. However in this example, the small-current detection side output voltage a becomes less than the reference output voltage when the detected current is 3 A or more. The large-current detecting circuit is provided to compensate for this. In this example, the current range which produces large-current side output is between 200 to 3000 mA. For reliability the current value of the large-current side is established to be considerably larger than the current value of the extreme of the small-current side (200 to 3000 mA in this case). The range of the output of the large current detecting side circuit can be suitably set by adjusting the voltage divider 19 shown in FIG. 10.

In a method according to the present invention, a large current detecting circuit and a small current detecting circuit are used in combination as described above. Accordingly, where the small current detecting circuit cannot follow the instantaneous flow of a large current in appliances such as an interrupter, a relay or the like, these appliances may be operated through detection of the current by the large current detecting circuit. Also, according to the present invention, a large current can be detected independently, when the large current detecting circuit is used without the small current detecting circuit.

Previously, a small current, such as a zero-phase current, could only be detected if it was an AC current, so that current in DC earth leakage breakers could not be detected. According to the present invention, a current is detected by the following steps: An iron core is excited by a high frequency to exceed its coercive force; The change in the high-frequency excitation current is taken out from the voltage drop across a detection resistor, or from the voltage change across a high-frequency excitation coil. The value of the high-frequency excitation current in the vicinity of the coercive force, or the extreme value of the high-frequency excitation current, is changed by a magnetic field induced by a detected current flowing in a conductor passing through the center hole of an iron core. Good linearity is shown between the output voltage and the detected current, so that a small AC current, a small DC current, or a small current in the form of a superposition of a DC current and an AC current can be detected. In addition to conventional AC appliances, DC earth-leakage circuit breakers with large instantaneous currents and the like can be produced without increasing their size. Further, according to the present invention, where a small AC current is detected, a relatively large output voltage can be obtained compared with the prior art method. Accordingly, control circuits, interrupting circuits, and the like, using output voltage have simplified construction. Further, the output voltage of conventional earth leakage breakers becomes small when a very large ground earth leakage current flows, so that an interrupter cannot be operated. Conversely, according to the present invention, a circuit for preventing this trouble can be added to the apparatus to maintain the interruptible output voltage even in the large-current side. Thus, the present invention provides a method for detecting both an AC current and a DC current in a wide range, from a small current value to a large current value.

It will be apparent to those skilled in the art that various modifications and variations can be made to the AC/DC current detecting method without departing from the scope or spirit of the instant invention and it is intended that the present invention cover the modifications and variations of the system provided that they come within the scope of the appended claims and their equivalents.

What is claimed is:

1. An AC/DC current detecting method utilizing a single annular iron core made of a high permeability material having a symmetrical rectangular-type hysteresis curve of magnetization and a smaller coercive force than a soft magnetic core, a single coil wound on the annular iron core, excited by an excitation circuit produced by a high frequency electric source, an excitation circuit connected between the excitation coil and the high frequency electric source, a detection resistor connected to the excitation circuit, and a conductor passing through a center hole of the annular iron core, the method comprising the steps of:

subjecting the single annular iron core having the single excitation coil to an excitation in a positive region and in a negative region, driving the magnetization of the annular iron core into saturation evenly in both regions where the magnetic flux density is substantially constant;

moving a range of the magnetization of the hysteresis curve to cause a change in a value of the excitation current corresponding to the coercive force value of the excitation in response to an impression of a magnetic field induced by a detected current flowing in the conductor;

obtaining the change in the value of the high frequency excitation current as one of a voltage change across the detection resistor and a voltage change across the single excitation coil; and calculating the detected current by a difference between absolute values of the voltage changes obtained in the obtaining step.

2. An AC/DC current detecting method according to claim 1, wherein
   the detected current is within saturation limits of the magnetic flux density of the annular iron core.

3. An AC/DC current detecting method utilizing a single annular iron core made of a high permeability material having a symmetrical rectangular-type hysteresis curve of magnetization and a smaller coercive force than a soft magnetic core, a single coil wound on the annular iron core, excited by an excitation current produced by a high frequency electric source, an excitation circuit connected between the excitation coil and the high frequency electric source, a detection resistor connected to the excitation circuit, and a conductor passing through a center hole of the annular iron core, the method comprising the steps of:

subjecting the single annular iron core having the single excitation coil to an excitation in a positive region and in a negative region, driving the magnetization of the annular iron core into saturation evenly in both regions where the magnetic flux density is substantially constant;

moving a range of the magnetization of the hysteresis curve to cause a change in an extreme value of the excitation current in response to an impression of a magnetic field induced by a detected current flowing in the conductor;

obtaining the change in the value of the high frequency excitation current as one of a voltage change across the detection resistor and a voltage change across the single excitation coil; and calculating the detected current by a difference between absolute values of the voltage changes obtained in the obtaining step.

4. An AC/DC current detecting method according to claim 3, wherein
   the detected current is within saturation limits of the magnetic flux density of the annular iron core.

5. An AC/DC current detecting method according to claim 1, wherein said iron core includes an amorphous alloy.

6. An AC/DC current detecting method according to claim 3, wherein said iron core includes an amorphous alloy.

* * * * *